(12) United States Patent
Lin

(10) Patent No.: US 11,432,414 B2
(45) Date of Patent: Aug. 30, 2022

(54) BACK COVER EJECTION STRUCTURE

(71) Applicant: Chiun Mai Communication Systems, Inc., New Taipei (TW)

(72) Inventor: Chia-Ju Lin, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 17/231,879

(22) Filed: Apr. 15, 2021

(65) Prior Publication Data

US 2021/0329798 A1   Oct. 21, 2021

(30) Foreign Application Priority Data

Apr. 16, 2020   (CN) .......................... 202010300974.7

(51) Int. Cl.
| | |
|---|---|
| *H05K 5/02* | (2006.01) |
| *H05K 5/03* | (2006.01) |
| *F16H 57/02* | (2012.01) |
| *F16H 37/12* | (2006.01) |
| *H04M 1/02* | (2006.01) |

(52) U.S. Cl.
CPC ........... *H05K 5/0217* (2013.01); *F16H 37/12* (2013.01); *F16H 57/02* (2013.01); *H05K 5/03* (2013.01); *F16H 2057/02039* (2013.01); *H04M 1/0249* (2013.01)

(58) Field of Classification Search
CPC ...... H05K 5/0217; H05K 5/03; H05K 5/0239; F16H 37/12; F16H 57/02; F16H 2057/02039; H04M 1/0249; H04M 1/0202; H04M 1/185
See application file for complete search history.

(56) References Cited

U.S. PATENT DOCUMENTS

| | | | |
|---|---|---|---|
| 8,203,844 B2* | 6/2012 | Sip ...................... | H04M 1/0262 361/728 |
| 8,540,327 B2* | 9/2013 | Chen ........................ | E05C 1/10 312/265.6 |
| 10,619,386 B2* | 4/2020 | Chen ..................... | E05B 65/006 |

(Continued)

FOREIGN PATENT DOCUMENTS

| | | |
|---|---|---|
| CN | 201927650 U | 8/2011 |
| CN | 206135997 U | 4/2017 |
| CN | 208432840 U | 1/2019 |

*Primary Examiner* — Hung S. Bui
*Assistant Examiner* — Sagar Shrestha
(74) *Attorney, Agent, or Firm* — ScienBiziP, P.C.

(57) ABSTRACT

A back cover ejection structure is applied in an electronic device. The electronic device includes a back cover and a middle frame, the back cover ejection structure can eject the back cover from the middle frame. The back cover ejection structure includes a housing, a moving plate, and a rotating cover. The moving plate is received in the housing and can move in a first direction. The moving plate includes a plate body and a first groove defined in the plate body. The first groove includes a first section, the first section inclined with the first direction. The rotating cover is rotatably connected to the housing. The rotating cover includes a sliding rod slidably received in the first section. The sliding rod can push the rotating cover to rotate when sliding in the first section, causing the rotating cover to eject the back cover from the middle frame.

18 Claims, 5 Drawing Sheets

(56) References Cited

U.S. PATENT DOCUMENTS

| | | | |
|---|---|---|---|
| 2011/0255256 A1* | 10/2011 | Chen .................. | H04M 1/0249 |
| | | | 361/759 |
| 2014/0170871 A1* | 6/2014 | Wu ..................... | H01R 13/447 |
| | | | 439/131 |
| 2019/0124187 A1* | 4/2019 | Zeng .................. | H04M 1/0254 |

* cited by examiner

BACK COVER EJECTION STRUCTURE

FIELD

The subject matter herein generally relates to a back cover ejection structure and an electronic device having the back cover ejection structure.

BACKGROUND

Electronic devices, such as mobile phones, include top covers and back covers connected to each other. If the back cover is made of glass, the back cover may easily get broken during use.

To remove the broken back cover the back cover may need to be heated to reduce an adhesion force of an adhesive layer on the back cover by a heating device, then slightly pulling up the back cover by a suction device, and separating the back cover from the top cover by a hard piece. However, the above method requires special tools, which increases the difficulty of the operation.

BRIEF DESCRIPTION OF THE DRAWINGS

Implementations of the present disclosure will now be described, by way of embodiment, with reference to the attached figures.

DETAILED DESCRIPTION

Implementations of the disclosure will now be described, by way of embodiments only, with reference to the drawings. It should be noted that the embodiments and the features of the present disclosure can be combined without conflict. Specific details are set forth in the following description to make the present disclosure to be fully understood. The embodiments are only portions of, but not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments and are not intended to limit the present disclosure. The term "and/or" as used herein includes any combination of one or more related items.

Figure 3:
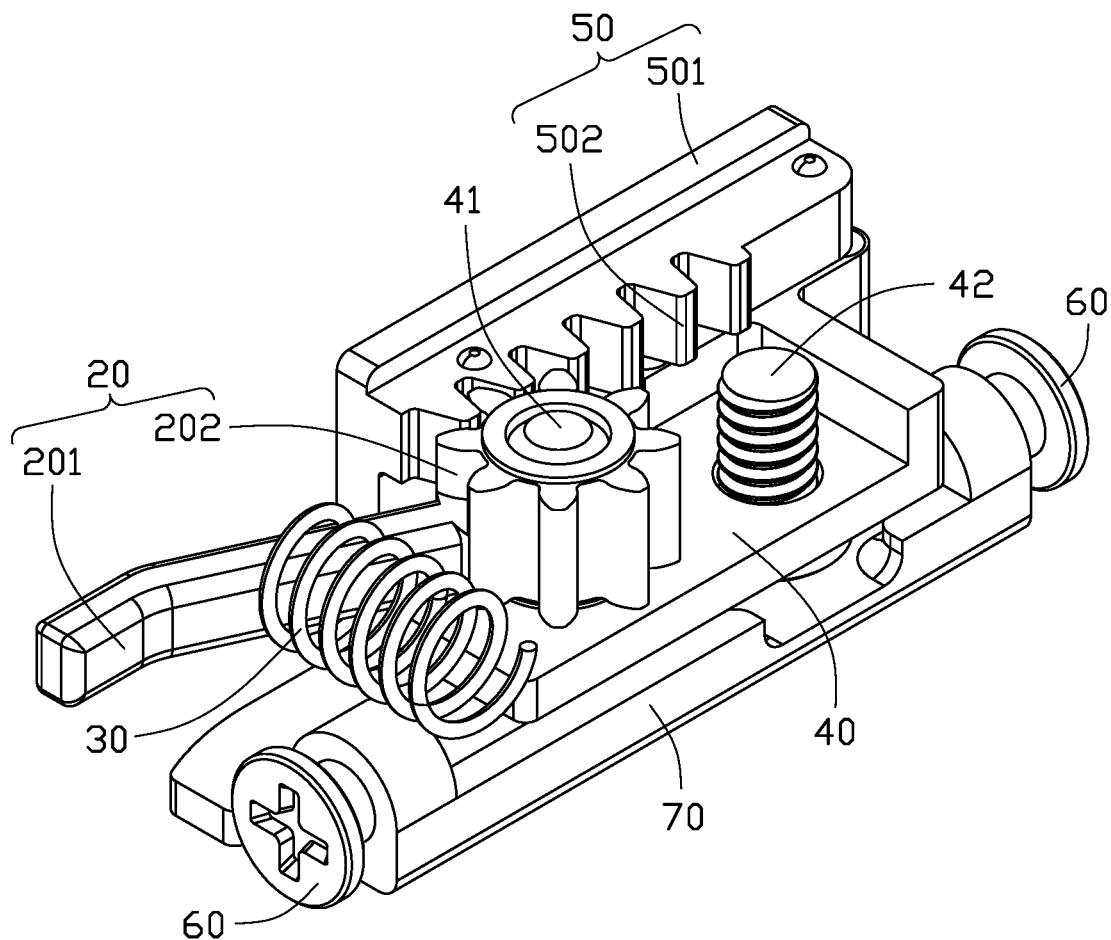
FIG. 3 is similar to FIG. 2, but showing the back cover ejection structure from another angle.
Figure 4:
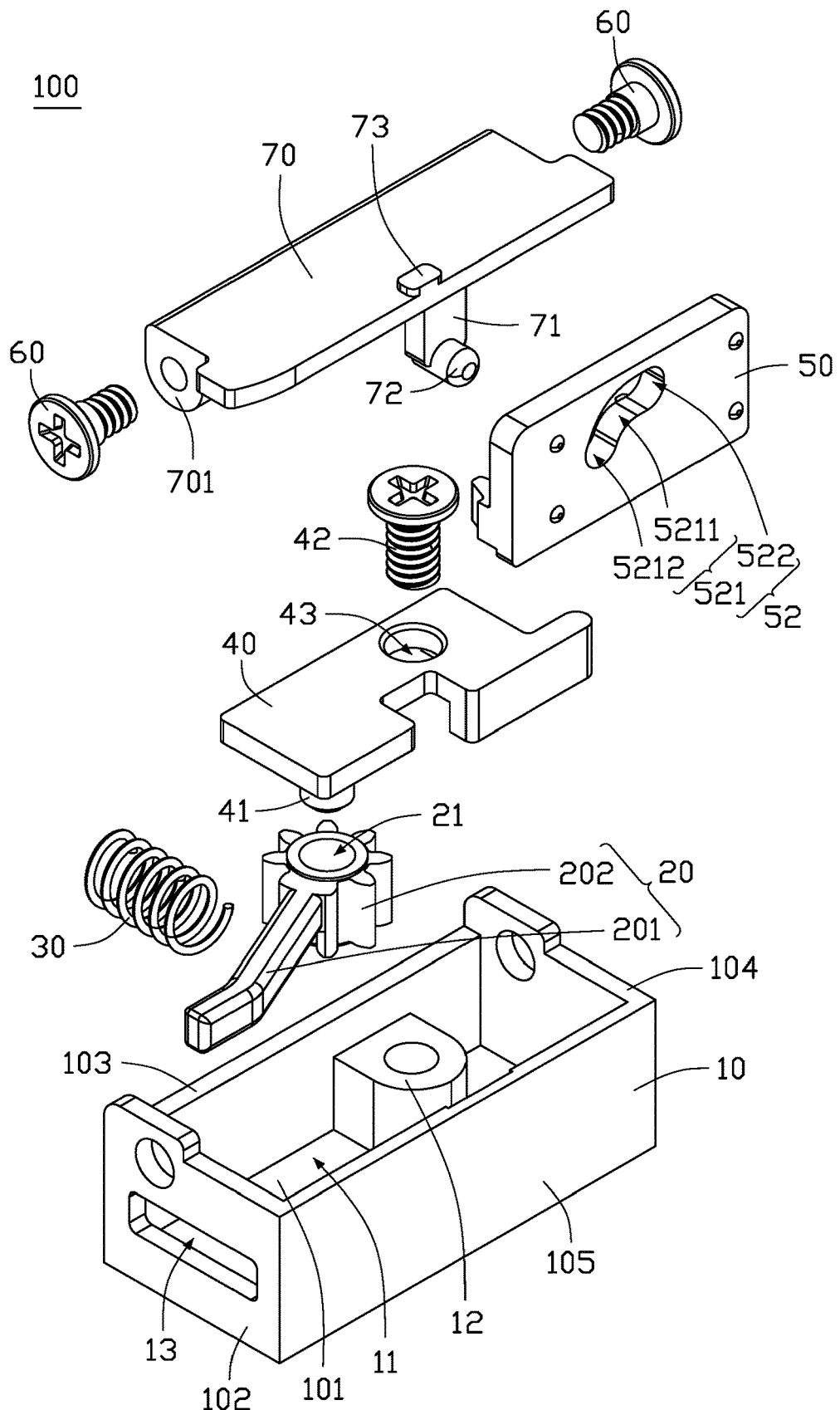
FIG. 4 is an exploded view of the back cover ejection structure of FIG. 1.
Figure 5:
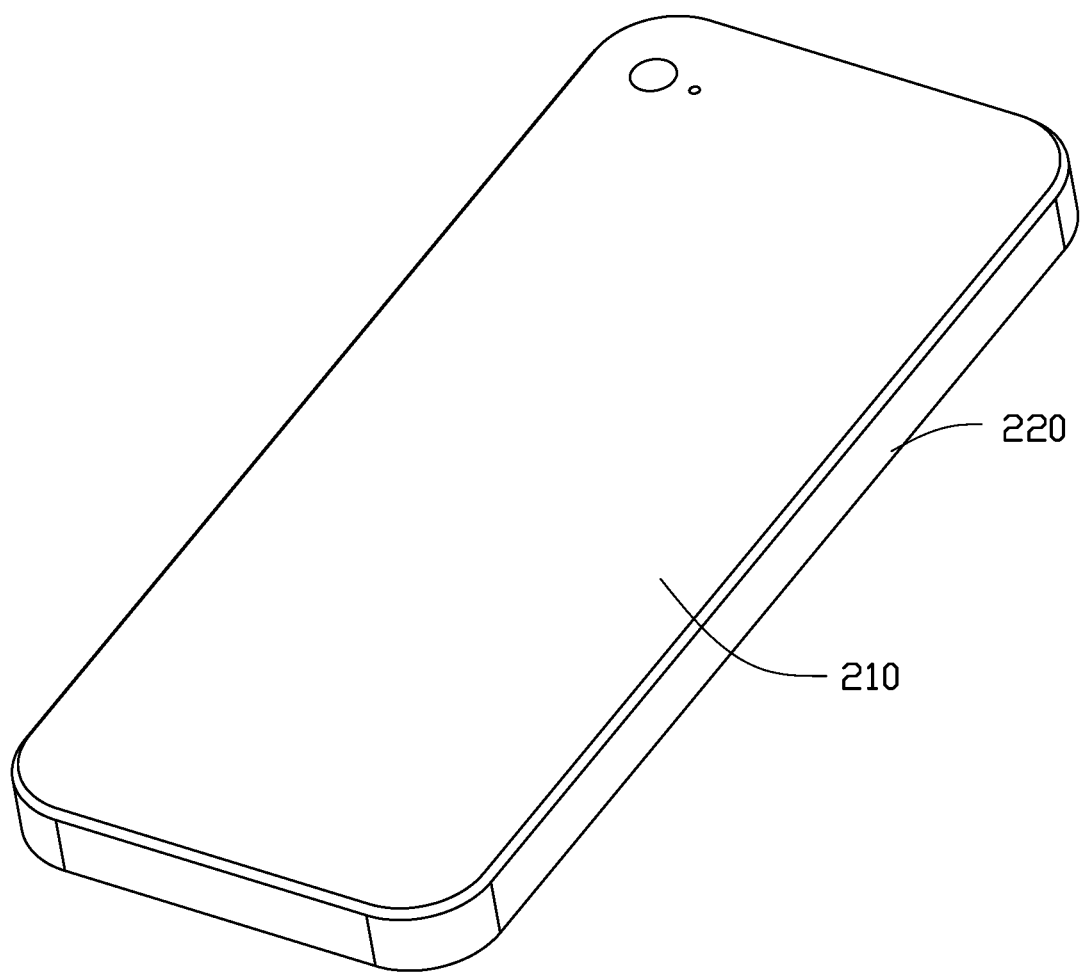
FIG. 5 is a diagrammatic view of an embodiment of an electronic device according to the present disclosure.

FIGS. 1 to 4 illustrate an embodiment of a back cover ejection structure 100, which can be applied to an electronic device 200 (shown in FIG. 5). The electronic device 200 includes a back cover 210 and a middle frame 220. The back cover ejection structure 100 can eject the back cover 210 from the middle frame 220. The back cover ejection structure 100 includes a housing 10, a driving member 20, an elastic member 30, a cover plate 40, a moving plate 50, a rotating shaft 60, and a rotating cover 70.

As shown in FIG. 4, the housing 10 includes a bottom wall 101, and a first sidewall 102, a second sidewall 103, a third sidewall 104, and a fourth sidewall 105 surrounding edges of the bottom wall 101. The first sidewall 102, the second sidewall 103, the third sidewall 104, and the fourth sidewall 105 are connected end to end in sequence. The first sidewall 102 and the third sidewall 104 are opposite to each other, and the second sidewall 103 and the fourth sidewall 105 are opposite to each other. The bottom wall 101, the first sidewall 102, the second sidewall 103, the third sidewall 104 and the fourth sidewall 105 cooperatively define a receiving space 11. The driving member 20, the elastic member 30, the cover plate 40, and the moving plate 50 are disposed in the receiving space 11. The rotating cover 70 is rotatably connected to the first sidewall 102 and the third sidewall 104 through the rotating shaft 60. A fixing seat 12 is disposed on the bottom wall 101 and received in the receiving space 11.

As shown in FIGS. 3 and 4, the driving member 20 includes a pushing rod 201 and a gear 202 connected to one end of the pushing rod 201. The first sidewall 102 defines an opening 13 passing through the first sidewall 102. An extending direction of the opening 13 is substantially parallel to the bottom wall 101. One end of the pushing rod 201 is slidably disposed in the opening 13, leaving the other end of the pushing rod 201 away from the gear 202 to protrude from the opening 13. The gear 202 defines a mounting hole 21. In at least one embodiment, the mounting hole 21 is substantially cylindrical.

The elastic member 30 elastically abuts between the pushing rod 201 and the second sidewall 103. The elastic member 30 can return the driving member 20 to its original position. In at least one embodiment, the elastic member 30 can be a spring. When the pushing rod 201 moves towards the second sidewall 103 in the opening 13 under an external force, the elastic member 30 is compressed, and the gear 202 rotates around the mounting hole 21. After the external force disappears, the compressed elastic member 30 rebounds to push the pushing rod 201 to slide in the opening 13, in a direction away from the second sidewall 103. As such, the driving member 20 returns to its original position.

The cover plate 40 is positioned on a surface of the driving member 20 away from the bottom wall 101. The cover plate 40 includes a mounting rod 41 passing through the mounting hole 21 of the gear 202, so that the gear 202 can rotate around the mounting rod 41. In at least one embodiment, the cover plate 40 also defines a through hole 43 penetrating the cover plate 40. A fixing member 42 passes through the through hole 43 and the fixing seat 12, thereby fixing the cover plate 40 in the receiving space 11. The fixing member 42 can be a screw.

Figure 1:
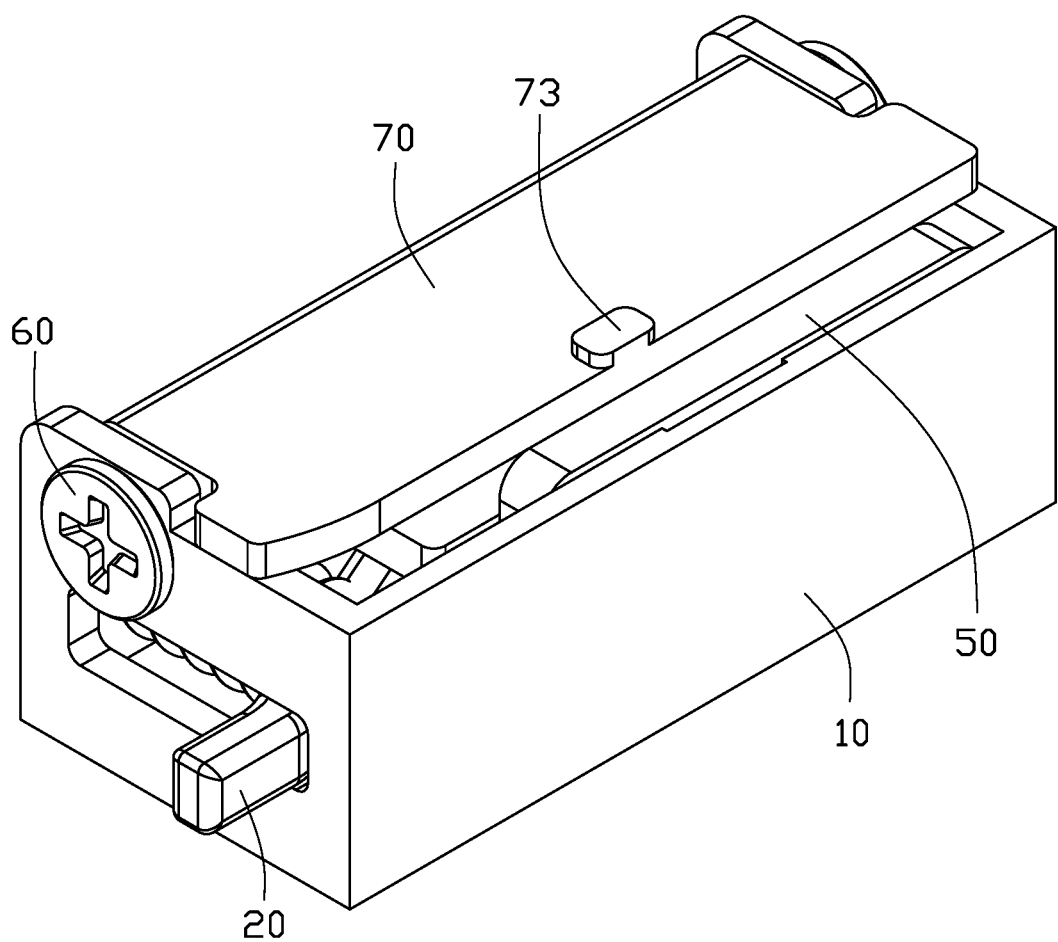
FIG. 1 is a diagrammatic view of an embodiment of a back cover ejection structure according to the present disclosure.
Figure 2:
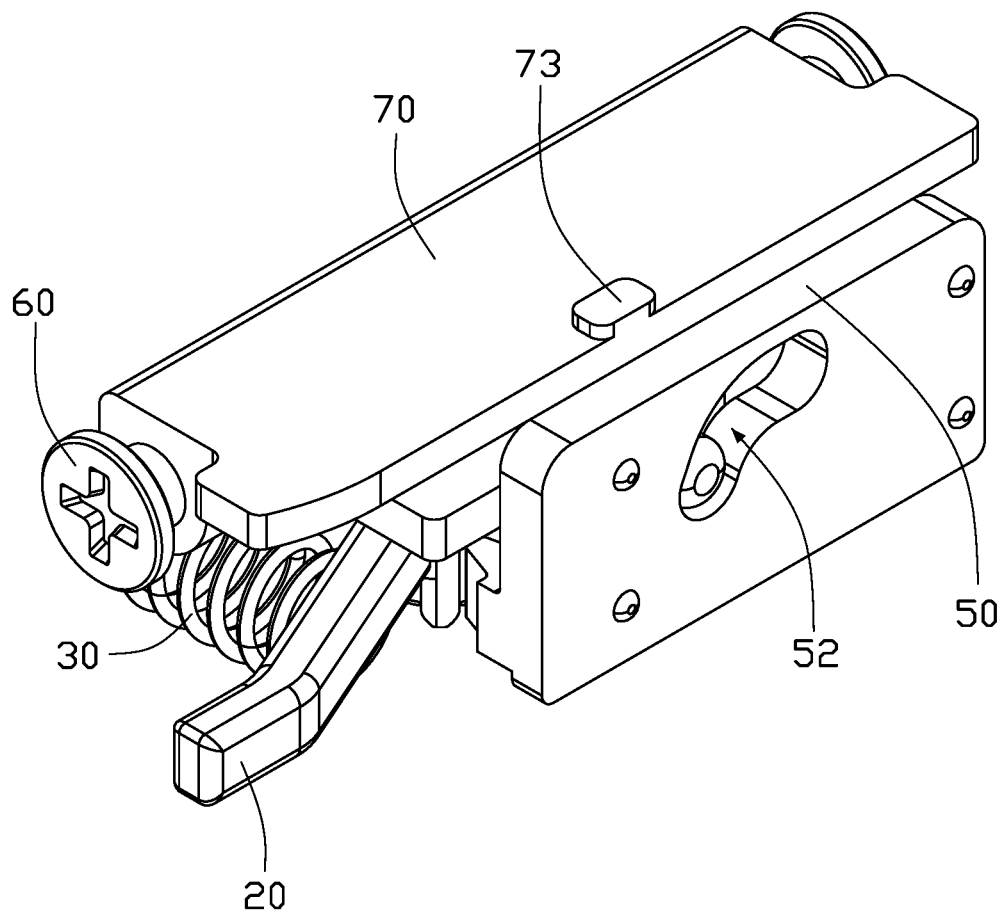
FIG. 2 is a diagrammatic view of the back cover ejection structure of FIG. 1 when a housing is removed.

The moving plate 50 is positioned on a side of the driving member 20 away from the second sidewall 103. The moving plate 50 includes a plate body 501 and a rack 502 disposed on the plate body 501. The rack 502 includes a plurality of teeth extending in a direction substantially perpendicular to the bottom wall 101. The rack 502 is engaged with the gear 202. When the gear 502 rotates, the rack 502 can move in a direction parallel to the bottom wall 101 (hereinafter referred to as "first direction"), thus the moving plate 50 also moves in the first direction. As shown in FIGS. 2 and 4, the moving plate 50 further defines a first groove 52 penetrating through the moving plate 50. The first groove 52 includes a first section 521 and a second section 522 connected to the first section 521. The first section 521 is inclined with the extending direction of the bottom wall 101 and the first direction, and is positioned between the second section 522 and the bottom wall 101. In the embodiment, the first section 521 includes a first end 5211 connected to the second section 522 and a second end 5212 opposite to the first end 5211. A distance between the first end 5211 and the bottom wall 101 is greater than a distance between the second end 5212 and the bottom wall 101. An extending direction of the second section 522 is substantially parallel to the bottom wall 101.

The rotating shaft 60 rotatably connects the rotating cover 70 to the housing 10. In at least one embodiment, there are two rotating shafts 60 opposite to each other. Two shaft seats 701 are provided at opposite ends of the rotating cover 70. The two rotating shafts 60 pass through the two shaft seats 701 of the rotating cover 70, and the two rotating shafts 60 are opposite to each other. The two rotating shafts 60 can rotate in the shaft seats 701, so that the rotating cover 70 can rotate with respect to the housing 10 around the rotating shaft 60. In other embodiments, there may be only one rotating shaft 60 passing through each of the two shaft seats 701.

The rotating cover 70 includes a connecting rod 71 facing the bottom wall 101 and a sliding rod 72 fixedly connected to the connecting rod 71. The sliding rod 72 is slidably disposed in the first groove 52. When the gear 202 rotates to drive the moving plate 50 to move, the sliding rod 72 slides in the first section 521 from the second end 5212 to the first end 5211. Since the distance between the first end 5211 and the bottom wall 101 is greater than the distance between the second end 5212 and the bottom wall 101, when the sliding rod 72 arrives the first end 5211, the distance between the sliding rod 72 and the bottom wall 101 increases, so that the rotating cover 70 can rotate around the rotating shaft 60. In at least one embodiment, when the sliding rod 72 slides in the first section 521, the rotating direction of the rotating cover 70 is perpendicular to the moving direction of the moving plate 50.

In at least one embodiment, the rotating cover 70 further includes an ejection block 73. The ejection block 73 is positioned on a surface of the rotating cover 70 opposite to the connecting rod 71 and the sliding rod 72. The ejection block 73 may be positioned at the edge of the surface of the rotating cover 70. For example, the ejection block 73 is positioned at a middle position of the edge of the rotating cover 70. The cross-sectional shape of the ejector block 73 may be rectangular, circular, or other regular or irregular shapes. When the back cover ejection structure 100 is applied to the electronic device 200, the rotating cover 70 faces the back cover 210. The ejection block 73 can eject the back cover 210 from the middle frame 220.

In other embodiments, the structure of the driving member 20 may be changed. For example, the driving member 20 may be a motor that can drive the moving plate 50 to move.

Referring to FIG. 5, the back cover ejection structure 100 can be applied to any electronic device 200 having the back cover 210 and the middle frame 220 connected to the back cover. For example, the electronic device 200 may be a cell phone. The back cover ejection structure 100 can be received in a receiving room (not shown) defined by the middle frame 220 and the back cover 210, and the rotating cover 70 face the back cover 210.

When the back cover ejection structure 100 includes the driving member 20, the other end of the pushing rod 201 away from the gear 202 may be exposed from the middle frame 220. As such, a user can push the pushing rod 201, thereby causing the gear 202 to move the rack 502. In other embodiments, the other end of the pushing rod 201 away from the gear 202 may also be disposed in the electronic device 200. For example, the middle frame 220 has a window, and the user insert his or her finger into the window and push the pushing rod 201.

In other embodiments, when the driving member 20 and the elastic member 30 are replaced with a motor, the electronic device 200 may further include control software (not shown) that control the motor to drive the moving plate 50 to move.

With the above configuration, when the moving plate 50 moves, the rotating cover 70 rotates around the rotating shaft 60, thereby ejecting the back cover 210 from the middle frame 220. As such, the replacement of the back cover 210 is facilitated.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A back cover ejection structure configured for an electronic device, the electronic device comprising a back cover and a middle frame, the back cover ejection structure being configured for ejecting the back cover from the middle frame, the back cover ejection structure comprising:
   a housing;
   a moving plate received in the housing and movable in a first direction, the moving plate comprising a plate body and a first groove defined in the plate body, the first groove comprising a first section inclined with the first direction; and
   a rotating cover rotatably connected to the housing, the rotating cover comprising a sliding rod slidably received in the first section, wherein when the sliding rod slides in the first section, the sliding rod pushes the rotating cover to rotate and causes the rotating cover to eject the back cover from the middle frame.

2. The back cover ejection structure of claim 1, wherein the housing comprises a bottom wall and a sidewall connected to the bottom wall, the sidewall and the bottom wall cooperatively define a receiving space, the moving plate is received in the receiving space, the rotating cover is rotatably connected to the sidewall;
   the first section comprises a first end and a second end opposite to the first end, a distance between the first end and the bottom wall is greater than a distance between the second end and the bottom wall.

3. The back cover ejection structure of claim 2, further comprising a driving member, wherein the driving member comprises a pushing rod and a gear connected to an end of the pushing rod, the moving plate further comprises a rack on the plate body, the rack is engaged with the gear and moves in the first direction when the gear rotates.

4. The back cover ejection structure of claim 3, further comprising an elastic member, wherein the elastic member elastically abuts between the pushing rod and the sidewall, the elastic member is configured to return the pushing rod to an original position.

5. The back cover ejection structure of claim 3, wherein the sidewall defines an opening extending parallel to the bottom wall, and one end of the pushing rod is slidably disposed in the opening.

6. The back cover ejection structure of claim 3, wherein the gear defines a mounting hole, the back cover ejection structure further comprises a cover plate on a surface of the driving member away from the bottom wall, the cover plate comprises a mounting rod, and the mounting rod extends through the mounting hole, and the gear rotates around the mounting rod.

7. The back cover ejection structure of claim 6, wherein a fixing seat is mounted on the bottom wall, the cover plate further comprises a fixing member, and the fixing member extends through the cover plate and the fixing seat, thereby fixing the cover plate in the receiving space.

8. The back cover ejection structure of claim 1, wherein the rotating cover further comprises an ejection block configured for ejecting the back cover from the middle frame, and the ejection block and the sliding rod are positioned on opposite surfaces of the rotating cover.

9. The back cover ejection structure of claim 1, further comprising a motor configured to drive the moving plate to move.

10. An electronic device, comprising:
a back cover;
a middle frame connected to the back cover; and
a back cover ejection structure comprising:
  a housing;
  a moving plate received in the housing and configured to move in a first direction, the moving plate comprising a plate body and a first groove defined in the plate body, the first groove comprising a first section inclined with the first direction; and
  a rotating cover rotatably connected to the housing and facing the back cover, the rotating cover comprising a sliding rod slidably received in the first section, wherein when the sliding rod slides in the first section, the sliding rod pushes the rotating cover to rotate and causes the rotating cover to eject the back cover from the middle frame.

11. The electronic device of claim 10, wherein the housing comprises a bottom wall and a sidewall connected to the bottom wall, the sidewall and the bottom wall cooperatively define a receiving space, the moving plate is received in the receiving space, the rotating cover is rotatably connected to the sidewall; the first section comprises a first end and a second end opposite to the first end, a distance between the first end and the bottom wall is greater than a distance between the second end and the bottom wall.

12. The electronic device of claim 11, wherein the back cover ejection structure further comprises a driving member, the driving member comprises a pushing rod and a gear connected to an end of the pushing rod, the moving plate further comprises a rack on the plate body, the rack is engaged with the gear and moves in the first direction when the gear rotates.

13. The electronic device of claim 12, wherein the back cover ejection structure further comprises an elastic member, the elastic member elastically abuts between the pushing rod and the sidewall, the elastic member is configured to return the pushing rod to an original position.

14. The electronic device of claim 12, wherein the sidewall defines an opening extending parallel to the bottom wall, and one end of the pushing rod is slidably disposed in the opening.

15. The electronic device of claim 12, wherein the gear defines a mounting hole, the back cover ejection structure further comprises a cover plate on a surface of the driving member away from the bottom wall, the cover plate comprises a mounting rod, and the mounting rod extends through the mounting hole, and the gear rotates around the mounting rod.

16. The electronic device of claim 15, wherein a fixing seat is mounted on the bottom wall, the cover plate further comprises a fixing member, and the fixing member extends through the cover plate and the fixing seat, thereby fixing the cover plate in the receiving space.

17. The electronic device of claim 10, wherein the rotating cover further comprises an ejection block configured for ejecting the back cover from the middle frame, and the ejection block and the sliding rod are positioned on opposite surfaces of the rotating cover.

18. The electronic device of claim 10, wherein the back cover ejection structure further comprises a motor configured to drive the moving plate to move.

* * * * *